(12) United States Patent
Wei et al.

(10) Patent No.: US 6,583,016 B1
(45) Date of Patent: Jun. 24, 2003

(54) DOPED SPACER LINER FOR IMPROVED TRANSISTOR PERFORMANCE

(75) Inventors: Andy C. Wei, Austin, TX (US); Mark B. Fuselier, Austin, TX (US); Ping-Chin Yeh, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/105,522

(22) Filed: Mar. 26, 2002

(51) Int. Cl.[7] .................. H01L 21/336; H01L 21/8238; H01L 21/31
(52) U.S. Cl. ............... 438/303; 438/301; 438/305; 438/306; 438/307; 438/230; 438/231; 438/783; 438/787
(58) Field of Search ............... 438/163, 373, 438/787, 595, 229–232, 301–307, 783

(56) References Cited

U.S. PATENT DOCUMENTS 6,156,598 A * 12/2000 Zhou et al. ............ 438/231
6,190,982 B1 * 2/2001 Tseng et al. ............ 438/230
6,235,600 B1 * 5/2001 Chiang et al. .......... 438/305
6,346,468 B1 * 2/2002 Pradeep et al. ......... 438/303

* cited by examiner

Primary Examiner—Carl Whitehead, Jr.
Assistant Examiner—David L. Hogans

(57) ABSTRACT

Semiconductor devices with improved transistor performance are fabricated by ion-implanting a dopant into the oxide liner to prevent or substantially reduce dopant out-diffusion from the shallow source/drain extensions. Embodiments include ion implanting a P-type dopant, such as B or $BF_2$, using the gate electrode as a mask, to form shallow source/drain extensions, depositing a conformal oxide liner, and ion implanting the P-type impurity into the oxide liner at substantially the same dopant concentration as in the shallow source/drain extensions. Subsequent processing includes depositing a spacer layer, etching to form sidewall spacers, ion implanting to form deep moderate or heavy source/drain implants and activation annealing.

10 Claims, 8 Drawing Sheets

DOPED SPACER LINER FOR IMPROVED TRANSISTOR PERFORMANCE

TECHNICAL FIELD

The present invention relates to a semiconductor device having improved transistor performance and enabling methodology. The present invention has particular applicability in fabricating high density semiconductor devices with high speed integrated circuits having submicron design features and shallow junction depths.

BACKGROUND ART

The escalating demand for high density and performance impose severe requirements on semiconductor fabrication technology, particularly for enhanced transistor performance and high operating speed. Transistor performance depends upon various factors and can easily be degraded by various processing operations during fabrication, such as plasma deposition techniques wherein the substrate is exposed to high temperatures and plasmas, as during plasma enhanced chemical vapor deposition. The need for high operating speed also requires the use of dielectric materials having a relatively low dielectric constant, such as about 3.9 or less. The value of a dielectric constant (k) expressed herein is based upon the value of 1 for a vacuum.

In implementing conventional fabrication techniques, as illustrated in FIG. 1, a gate electrode 11 is typically formed over a semiconductor substrate 10 with a gate dielectric layer 12, e.g., gate oxide layer, therebetween. Ion implantation is then conducted to implant shallow source/drain extensions 13. An oxide liner 14 is then formed on side surfaces of gate electrode 11 and the upper surface of substrate 10, as at a thickness of about 50 Å to about 200 Å to protect the substrate surface during subsequent etching to form sidewall spacers 15, typically formed of silicon nitride. Reference character 14 illustrates a moderate or heavy doped source/drain region typically implanted subsequent to forming sidewall spacers 16.

Difficulties are encountered in implemented conventional semiconductor fabrication techniques, such as those used to form the structure illustrated in FIG. 1. For example, during high temperature processing, as during deposition of the silicon oxide liner 14, by low pressure chemical vapor deposition, typically at a temperature of about 700° C. or higher, dopant impurities implanted into the source/drain extensions 13, such as P-type impurities, e.g., boron (B) and boron difluoride ($BF_2$) impurities, diffuse and segregate in the oxide liner 14. A lower-temperature 400° C. CVD liner oxide can be used to prevent such out diffusion and dopant loss. However, dopant loss occurs during high temperature activation appealing, as at a temperature greater than 1000° C. for 5 to 10 seconds. Such diffusion loss from the source/drain extensions are manifestly. disadvantageous, as by increasing the resistance of the source/drain extensions. A prior attempt to resolve this problem comprises ion implanting the dopant impurity, e.g., B or $BF_2$, at a higher implantation dosage than necessary in order to compensate for dopant diffusion loss. However, this approach disadvantageously results in a deeper junction depth ($X_j$), which is inconsistent with the continuous drive toward miniaturization.

DISCLOSURE OF THE INVENTION

An advantage of the present invention is a method of fabricating a high density semiconductor device having transistors with improved performance.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect the present invention, the foregoing and other advantages are achieved in part by a method of manufacturing a semiconductor device, the method comprising: forming a gate electrode, having side surfaces, over an upper surface of a substrate with a gate dielectric layer therebetween; ion-implanting a dopant into the substrate, using the gate electrode as a mask; to form shallow source/drain extensions; forming an oxide liner on the side surfaces of the gate electrode and upper surface of the substrate; and ion-implanting the dopant into the oxide liner.

Embodiments of the present invention include ion-implanting B or $BF_2$ into the substrate to form shallow source/drain extensions having a first impurity concentration, depositing a conformal oxide liner on the upper surface and side surfaces of the gate electrode and on the upper surface of the substrate, ion-implanting B or $BF_2$ into the oxide liner at the substantially same impurity concentration as in the source/drain extensions, e.g., about $1 \times 10^{20}$ to about $6 \times 10^{20}$ atoms/cm$^3$, depositing a spacer layer, such as silicon nitride or silicon oxynitride, and etching to form sidewall spacers. The portion of the silicon oxide liner on the upper surface of the gate electrode may then be removed. Ion-implantation is conducted to form the deep moderate or heavy doped source/drain regions, either before or subsequent to removing the portion of the oxide liner from the upper surface of the gate electrode. Activation annealing may then be conducted.

Additional advantages and aspects of the present invention will become readily apparent to those skilled in the art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modification in various obvious respects, all without departing from the present invention. Accordingly, the drawings and description are to be regarded as illustrative in nature, and not as restrictive.

BRIEF DESCRIPTION OF THE DRAWINGS

In FIGS. 2 through 4, and in FIGS. 5 through 8, similar features or elements are denoted by similar reference characters.

DESCRIPTION OF THE INVENTION

Figure 1:
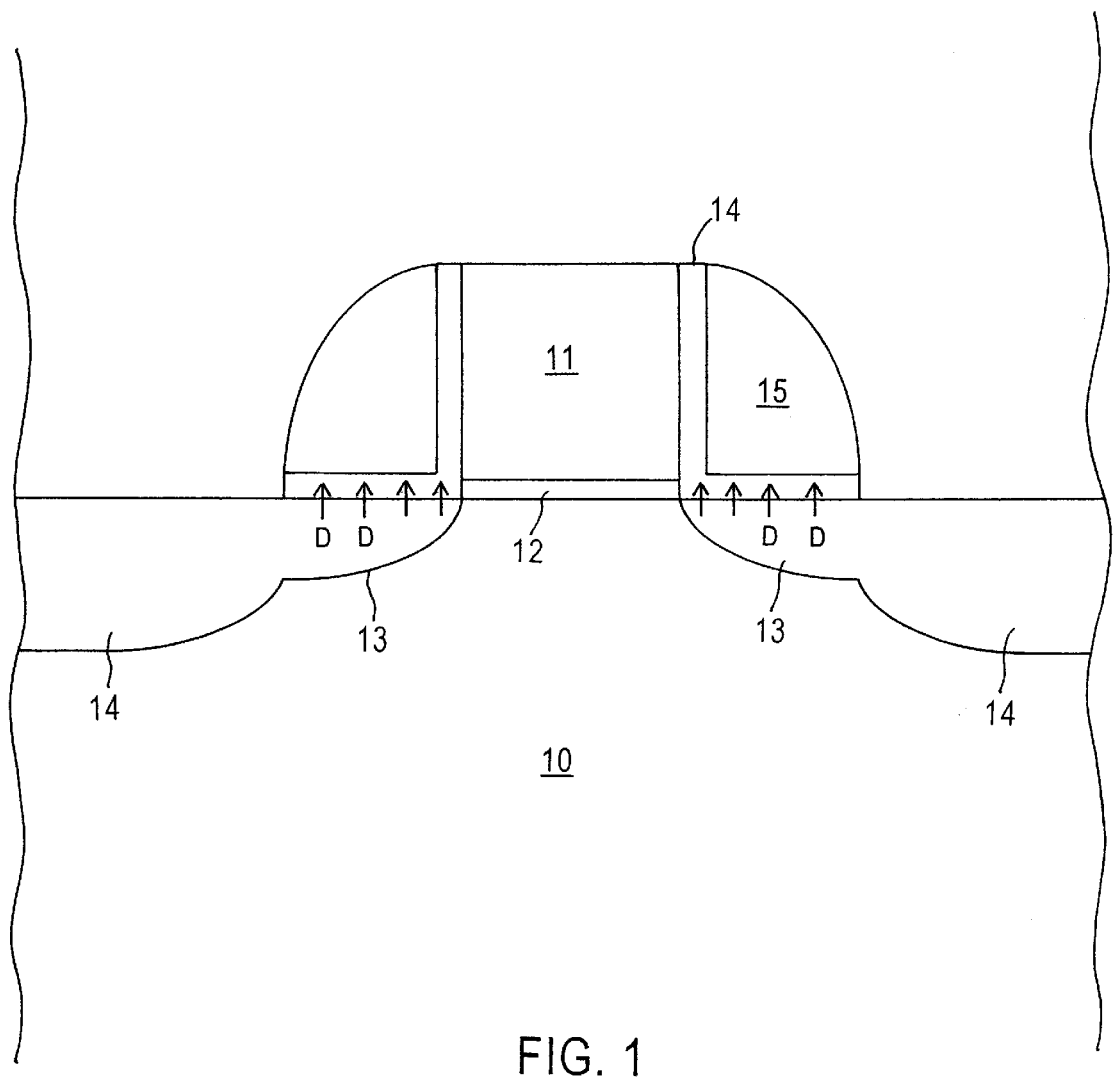
FIG. 1 schematically illustrates dopant out-diffusion attendant upon conventional transistor fabrication techniques.

The present invention addresses the continuing demand for high density, miniaturized highly reliable semiconductor devices. The present invention provides semiconductor devices with enhanced transistor performance, and enabling methodology, by strategically creating a barrier to outdiffusion of impurities from the shallow source/drain extensions into the oxide liner. Embodiments of the present invention, achieve this objective by ion implanting the impurities into the oxide liner, as at a dopant impurity concentration of about 1 atomic percent. The present invention, therefore, provides methodology which avoids or significantly reduces out-diffusion of impurities, such as P-type impurities, e.g., B and $BF_2$, while maintaining a shallow junction depth ($X_j$) of about 200 Å to about 300 Å.

Embodiments of the present invention comprise forming a gate electrode over a semiconductor substrate with a gate dielectric layer therebetween and ion implanting a dopant impurity, such as $BF_2$, into the substrate, using the gate electrode as a mask, to form shallow source/drain regions. Such ion implantation can be conducted in a conventional manner, as by ion-implanting $BF_2$ at an implantation dosage of about $5 \times 10^{14}$ to about $2 \times 10^{15}$ ions/cm$^2$ and an implantation energy of about 1 to about 3 KeV, typically resulting in an impurity concentration of about $1 \times 10^{20}$ to about $6 \times 10^{20}$ atoms/cm$^3$.

A silicon oxide liner is then deposited, as at a thickness of about 50 Å to about 200 Å, on the upper surface and side surfaces of the gate electrode and the upper surface of the substrate. Ion implantation is then conducted to implant $BF_2$ impurities into the oxide liner, substantially under the same conditions as employed in forming the shallow source/drain extensions, e.g., at an implantation energy of about $5 \times 10^{14}$ to about $2 \times 10^{15}$ ions/cm$^2$ and implantation energy of about 1 to about 3 KeV, thereby forming an impurity concentration in the oxide liner of about $1 \times 10^{20}$ to about $6 \times 10^{20}$ atoms/cm$^3$.

A spacer layer, such as a silicon nitride or a silicon oxynitride, may then be deposited, as at a thickness of about 600 Å to about 1200 Å. Anisotropic etching is then conducted to form the sidewall spacers. Ion-implantation of $BF_2$ is then implemented to form the relatively deep moderate or heavy source/drain implants. The portion of the silicon oxide liner on the upper surface of the gate electrode may be removed, either before or after ion-implantation to form the relatively deep moderate or heavily doped source/drain implants, as with hydrofluoric acid. Activation annealing may then be conducted. The strategic implantation of dopant impurities into the silicon oxide liner to create a diffusion barrier prevents or significantly reduces out-diffusion of the impurities from the shallow source/drain regions during subsequent processing, as during deposition of the spacer layer and activation annealing.

Figure 2:
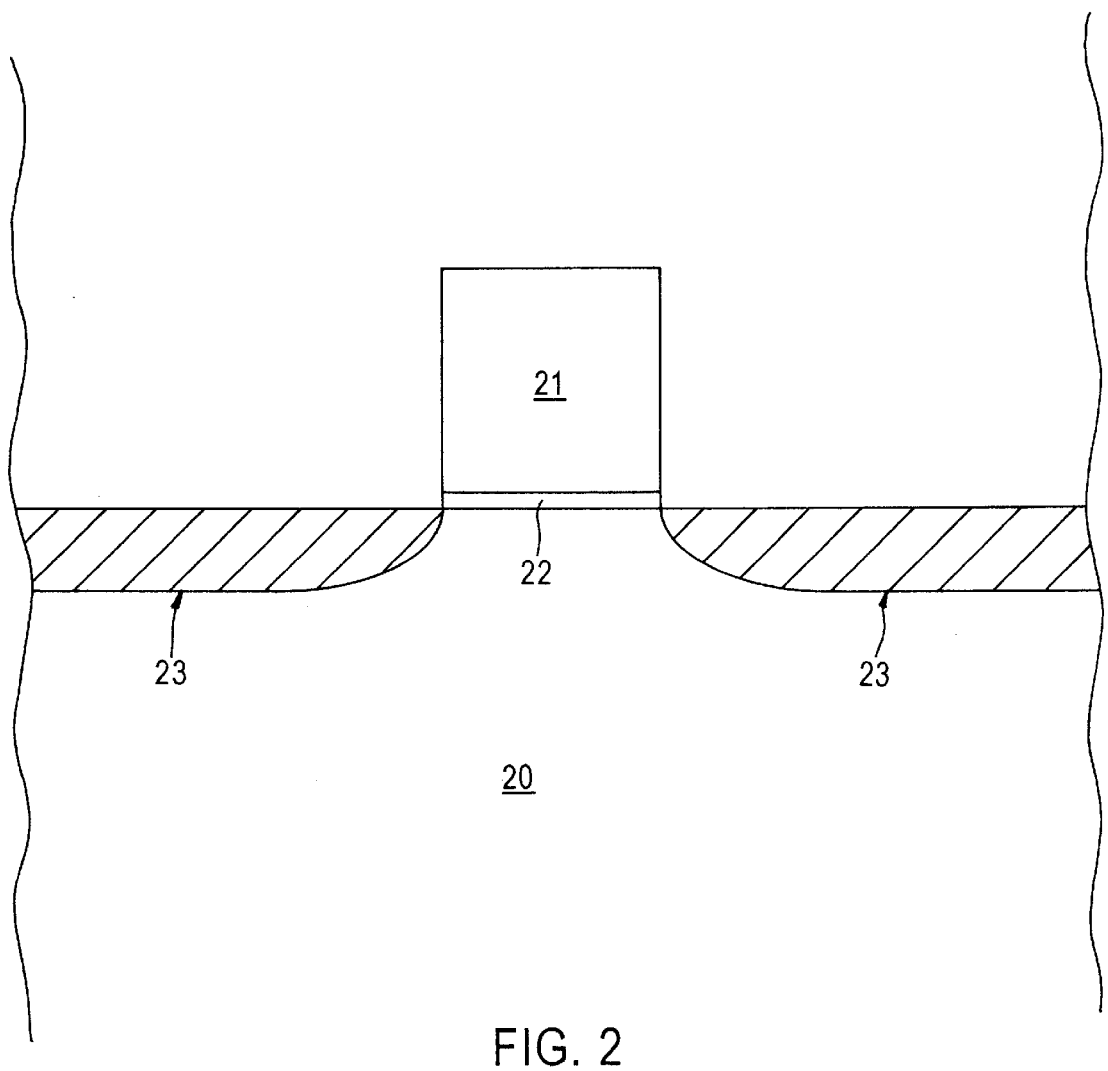
FIGS. 2 though 4 schematically illustrate sequential steps of a method in accordance with an embodiment of the present invention.
Figure 3:
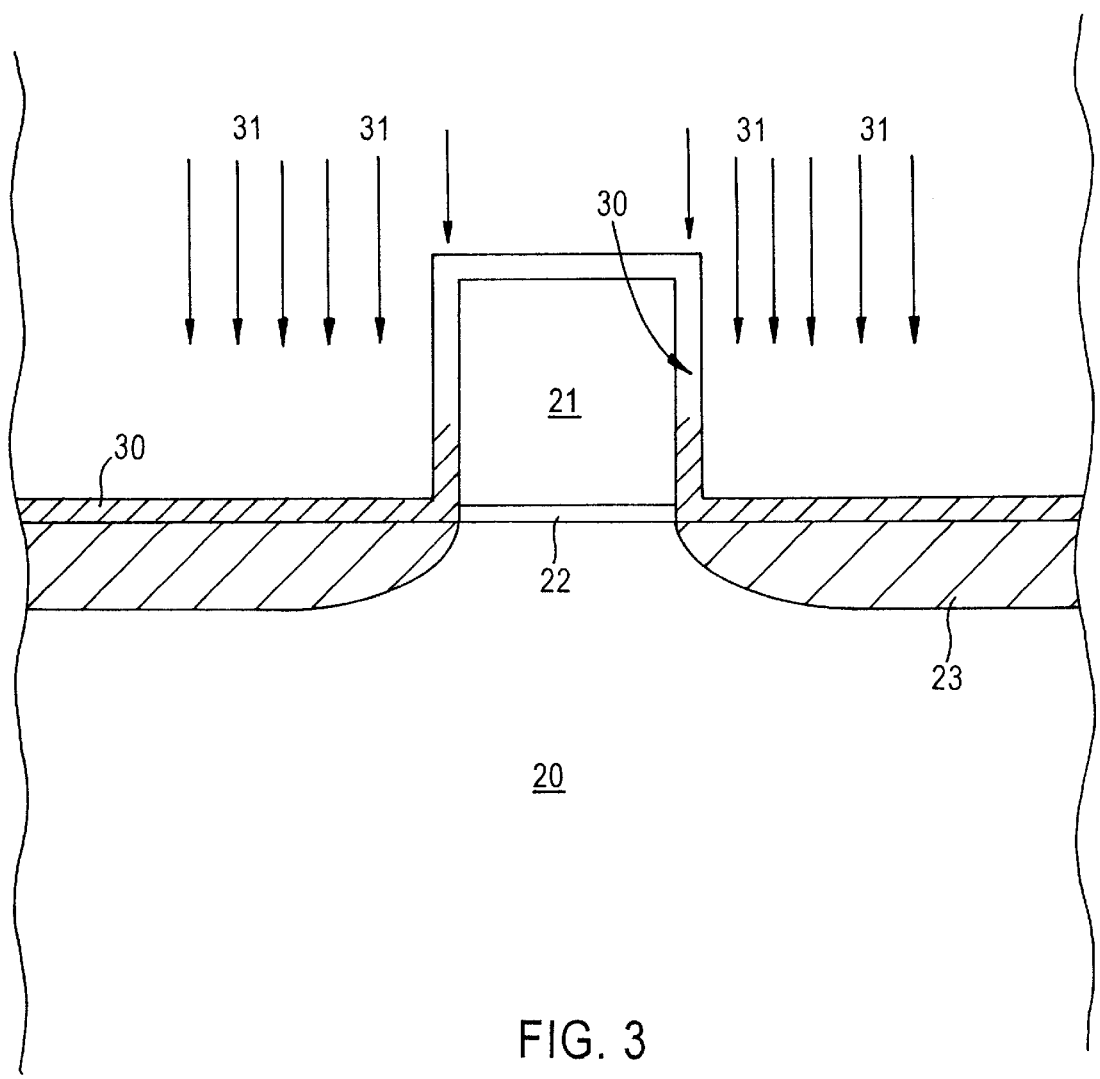
Figure 4:
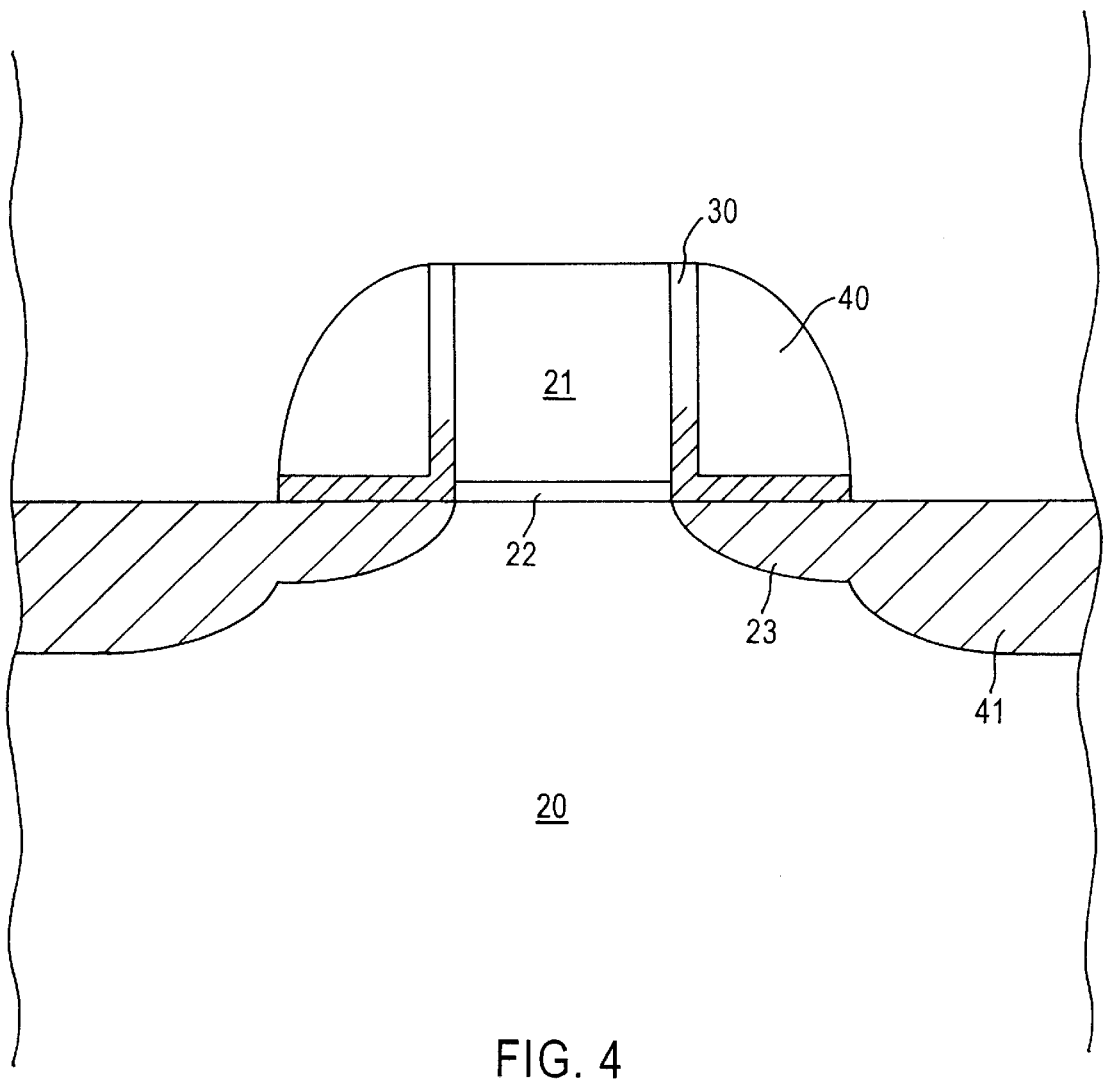
Figure 5:
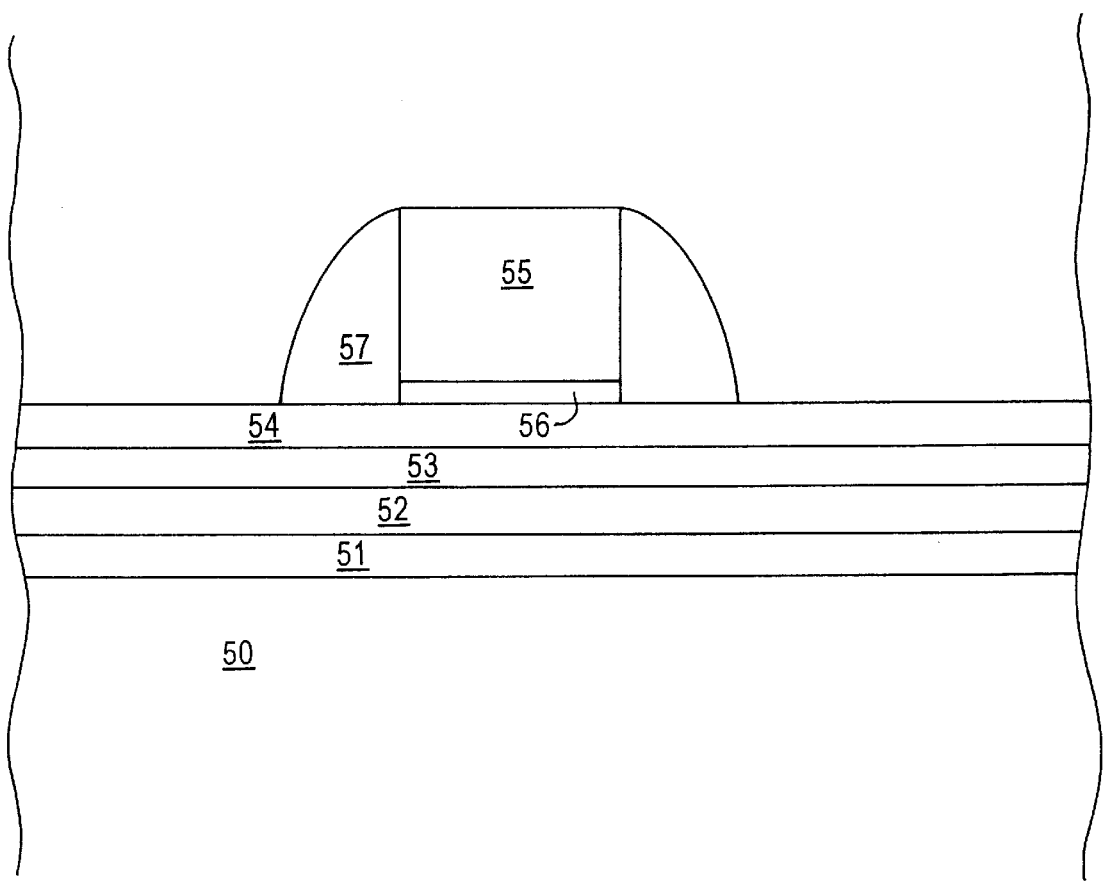
FIGS. 5 through 8 schematically illustrate sequential phases of another inventive aspect.

An embodiment of the present invention is schematically illustrated in FIGS. 2 through 4, wherein similar elements or features are denoted by similar reference and numerals. Adverting to FIG. 2, a gate electrode 21, typically doped polycrystalline, is formed over substrate 20, typically doped monocrystalline silicon, an epitaxial layer formed on a semiconductor substrate or a well region. Using the gate electrode 21 as a mask, impurities are ion implanted into substrate 20, such as $BF_2$, for forming shallow source/drain extensions 23. Subsequently, as illustrated in FIG. 3, a silicon oxide liner 30 is deposited, as at a thickness of about 50 Å to about 200 Å, on the upper and side surfaces of gate electrode 21 and on the upper surface of substrate 20. Ion implantation is then conducted, as illustrated by arrows 31 in FIG. 3, to implant $BF_2$ into oxide liner 31, substantially at the same concentration as implanted into shallow source/drain extensions 23, thereby creating a barrier to out-diffusion of $BF_2$ atoms from shallow source/drain extensions 23.

Subsequently, a layer of spacer material is deposited and anisotropic etching is conducted to form sidewall spacers 40, typically at a thickness at the substrate surface of about 600 Å to about 1,200 Å, as illustrated in FIG. 4. Silicon oxide layer 30 serves as an etch stop layer during etching to form sidewall spacers 40, thereby avoiding damage to substrate 20. Subsequent processing includes removal of silicon oxide liner 30, as with hydrofluoric acid, from the upper surface of gate electrode 21 and substrate 20. Ion implantation is conducted to form deep moderate or heavy doped source/drain regions 41, prior or subsequent to removing the portions of silicon of silicon oxide layer 40 from the upper surface of gate electrode 21 and substrate, resulting in the structure schematically illustrated in FIG. 4.

Another inventive aspect comprises methodology enabling the selective optimization of the source and drain region thicknesses in dual buried oxide (BOX) silicon-on-insulative (SOI) structures. Such inventive methodology is schematically illustrated in FIGS. 5 through 8, wherein similar features or elements are denoted by similar reference characters. Adverting to FIG. 5, a dual BOX structure comprises a substrate formed of silicon 50, BOX 51, silicon layer 52, BOX 53 and silicon layer 54. A gate electrode 55 is formed over the dual BOX substrate with a gate dielectric layer 56 therebetween, and sidewall spacers 57 are formed on side surfaces of gate electrode 55.

Figure 6:
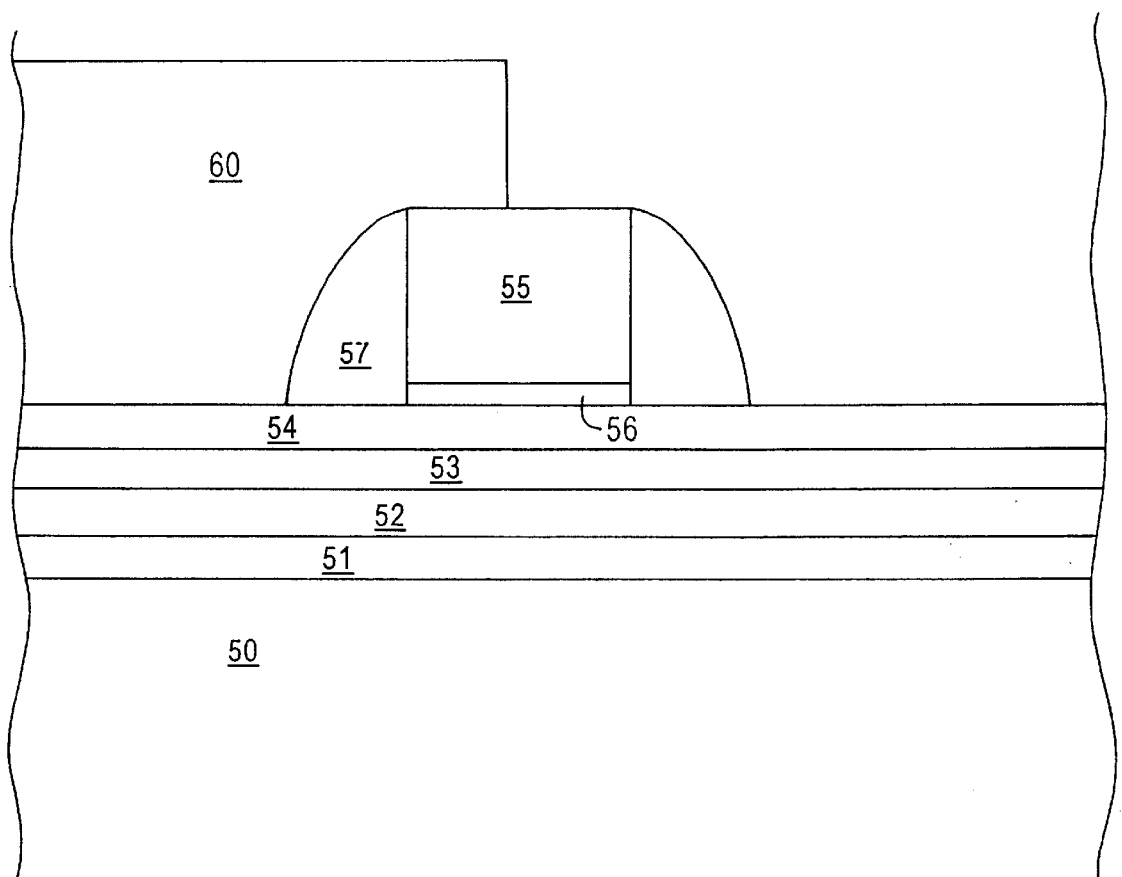
Figure 7:
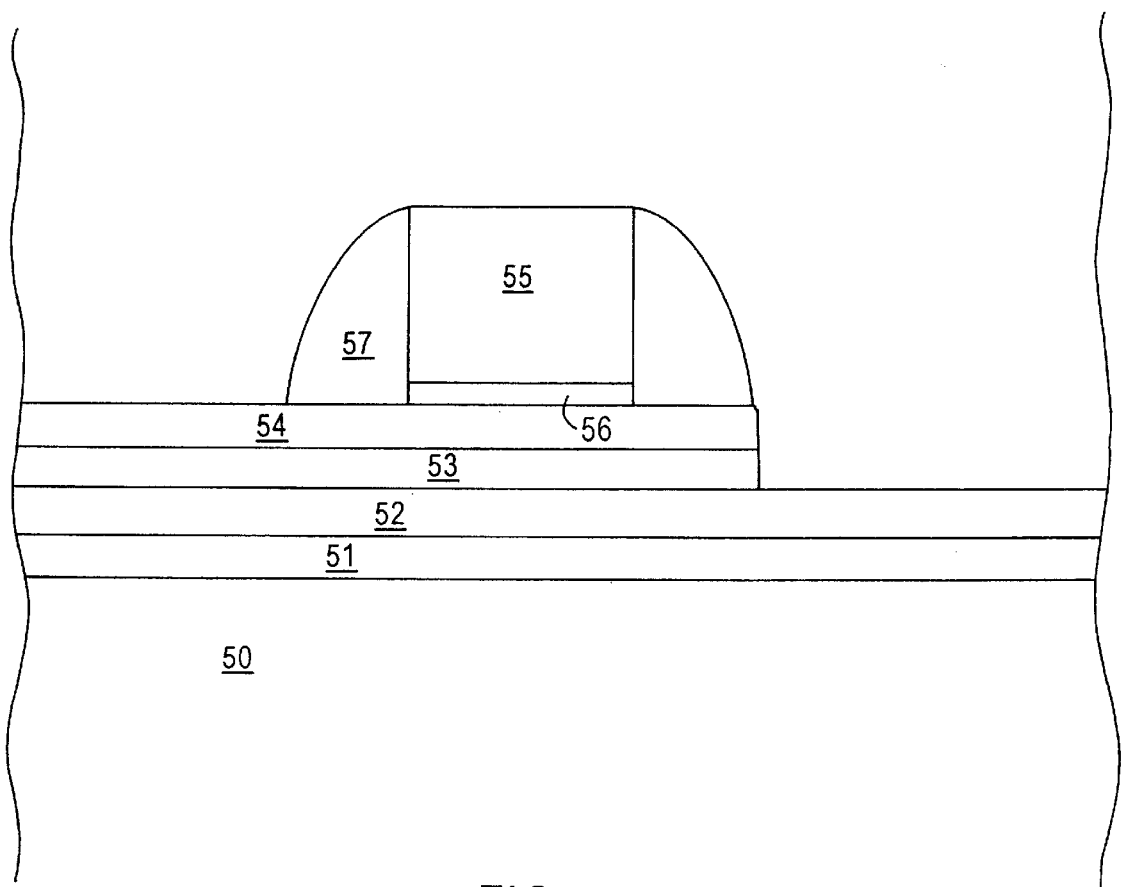
Figure 8:
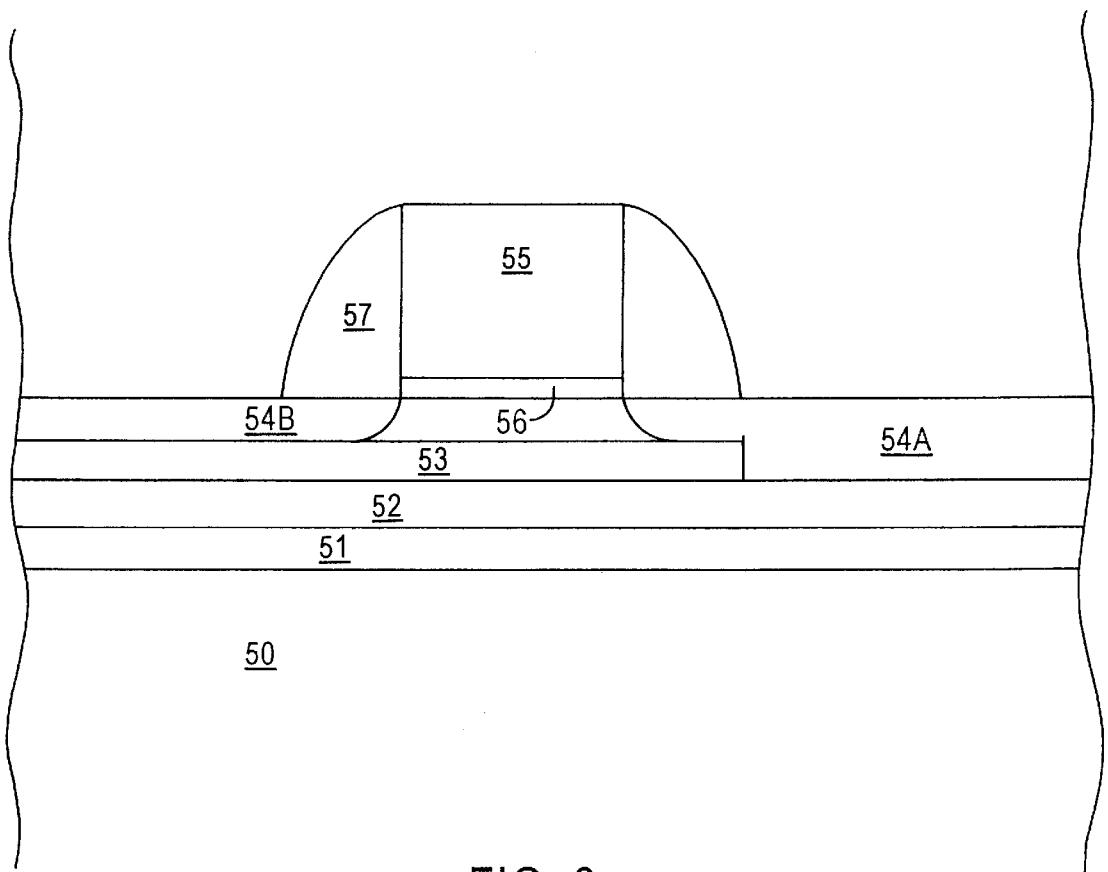

A photoresist mask 60 is then formed over the source-side of the structure as illustrated in FIG. 6. Etching is then conducted to remove the top silicon layer 54 and upper BOX layer 53 from the drain-side, as shown in FIG. 7. Subsequently, as illustrated in FIG. 8, silicon is expitaxially grown 54A from the lower silicon layer 52. In this way, a deeper drain region 54A can be formed independently of the source region 54B.

The present invention enables the fabrication of semiconductor devices exhibiting improved transistor performance and shallow junction depths ($X_j$), e.g., of about 200 Å to about 300 Å. Impurities of the same type and at substantially the same concentration as in the shallow source/drain extensions are implanted into the oxide liner, thereby preventing or substantially reducing outdiffusion of the impurities from the shallow source/drain extensions with an attendant improvement in source/drain extension resistance and significant improvement in transistor performance, consistent with the continuous drive for miniaturization.

The present invention enjoys industrial utility in fabricating any of various types of semiconductor devices. The present invention enjoys particular industrial in fabricating high density semiconductor devices with a design rule of about 0.12 micron.

In the previous description, numerous specific details are set forth, such as specific materials, structures, reactants, processes, etc., in order to provide a better understanding of the present invention, however, the present invention can be practiced without resorting to the details specifically set forth. In other instances, well-known processing materials and techniques have not been described in order not to unnecessarily obscure the present invention.

Only the preferred embodiment of the invention and but a few examples of its versatility are shown and described in the present disclosure. It is to be understood that the present invention is capable of use in various other combinations and environments, and is capable of changes or modifications within the scope of the inventive concept as expressed herein.

What is claimed is:

1. A method of manufacturing a semiconductor device, the method comprising sequentially:
   forming a gate electrode, having side surfaces, over an upper surface of a substrate with a gate dielectric layer therebetween;
   ion-implanting a dopant into the substrate, using a gate electrode as a mask, to form shallow source/drain extensions;
   forming an oxide liner on the side surfaces of the gate electrode and the upper surface of the substrate; and
   ion-implanting the dopant into the oxide liner.

2. The method according to claim 1, further comprising:
   depositing a layer of spacer materials on the oxide liner;
   etching to form sidewall spacers on the oxide liner;
   ion-implanting the dopant into the substrate to form deep moderate or heavily doped implants; and
   activation annealing.

3. The method according to claim 2, comprising:
   forming the oxide liner comprising silicon oxide; and
   forming the spacer layer comprising silicon nitride or silicon oxynitride.

4. The method according to claim 3, comprising ion-implanting a P-type impurity as the dopant.

5. The method according to claim 4, comprising ion-implanting boron (B) or boron difluoride ($BF_2$) as the dopant.

6. The method according to claim 2, comprising:
   ion-implanting the dopant into the substrate to form the shallow source/drain extensions at a first impurity concentration; and
   ion-implanting the dopant into the oxide liner at an impurity concentration substantially equal to the first impurity concentration.

7. The method according to claim 6, comprising ion-implanting the dopant into the substrate and to form the shallow source/drain extensions and into the oxide liner at a concentration of about $1 \times 10^{20}$ to about $2 \times 10^{20}$ atoms/cm$^3$.

8. The method according to claim 2, comprising ion-implanting the dopant impurity into the oxide liner such that the dopant concentration in the oxide liner is about 1 atomic percent.

9. The method according to claim 5, comprising ion-implanting $BF_2$ into of the oxide liner at an implantation dosage of about $5 \times 10^{14}$ to about $2 \times 10^{15}$ ions/cm$^2$ and at an implantation dosage of about 1 to about 3 KeV.

10. The method according to claim 1, comprising forming the oxide liner at a thickness of about 50 Å to about 200 Å.

* * * * *